(12) United States Patent
Mizutani et al.

(10) Patent No.: US 8,426,884 B2
(45) Date of Patent: *Apr. 23, 2013

(54) LIGHT EMITTING DIODE WITH SUPPORTING SUBSTRATE SIDE ELECTRODES AND WIRING STRUCTURES

(75) Inventors: Tomoya Mizutani, Hitachi (JP); Tsunehiro Unno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 13/214,650

(22) Filed: Aug. 22, 2011

(65) Prior Publication Data

US 2012/0049224 A1    Mar. 1, 2012

(30) Foreign Application Priority Data

Sep. 1, 2010 (JP) ................................. 2010-196081
Dec. 10, 2010 (JP) ................................. 2010-275210

(51) Int. Cl.
*H01L 33/00*    (2010.01)
*H01L 29/18*    (2006.01)

(52) U.S. Cl.
USPC ................. 257/98; 257/88; 257/99; 257/100

(58) Field of Classification Search .......................... None
See application file for complete search history.

(56) References Cited

U.S. PATENT DOCUMENTS 7,663,138 B2    2/2010 Fujikura
8,138,516 B2 *  3/2012 Unno ............................. 257/98
2005/0253161 A1 * 11/2005 Horio et al. .................... 257/100
2007/0262293 A1   11/2007 Fujikura
2010/0148202 A1 *  6/2010 Tomoda ........................ 257/98
2012/0126259 A1 *  5/2012 Mizutani et al. ............... 257/88

FOREIGN PATENT DOCUMENTS

| JP | 2007305851 A | 11/2007 |
| JP | 200878225 A | 4/2008 |
| JP | 2009059883 A | 3/2009 |

* cited by examiner

*Primary Examiner* — Wensing Kuo
*Assistant Examiner* — Moazzam Hossain
(74) *Attorney, Agent, or Firm* — Marty Fleit; Paul D. Bianco; Fleit Gibbons Gutman Bongini Bianco PL

(57) ABSTRACT

A light emitting diode, comprising: a wiring layer; and a semiconductor light emitting element provided on the wiring layer, the semiconductor light emitting element further comprising: a semiconductor light emitting layer; a transparent conductive layer; a metal reflection layer; a transparent insulating film; and a first electrode part and a second electrode part provided on the wiring layer side of the transparent insulating film with an isolating region interposed between them, to be electrically connected to the wiring layer, wherein the first electrode part is electrically connected to the first semiconductor layer by a first contact part, and the second electrode part is electrically connected to the second semiconductor layer by a second contact part which is provided to pass through the transparent insulating film, the transparent conductive layer, the first semiconductor layer, and the active layer.

9 Claims, 9 Drawing Sheets

LIGHT EMITTING DIODE WITH SUPPORTING SUBSTRATE SIDE ELECTRODES AND WIRING STRUCTURES

The present application is based on Japanese Patent Applications No. 2010-196081 filed on Sep. 1, 2010, and No. 2010-275210 filed on Dec. 10, 2010, the entire contents of which are hereby incorporated by reference.

BACKGROUND OF THE INVENTION

1. Field of the Invention

The present invention relates to a light emitting diode, and further specifically relates to a light emitting diode having a structure in which two electrodes formed on a substrate side of a semiconductor light emitting element are connected to wiring on a substrate.

2. Description of the Related Art

In recent years, light emitting diodes (LEDs hereafter), being semiconductor light emitting elements, realize high electric and optical conversion efficiency owing to an improvement of a crystal quality. With higher light emitting efficiency and smaller influence of heat generation, use of the LED in a large current is realized. Therefore, there is a wider application of the LED to a light source for illumination which requires a high luminance compared with LED for display.

In order to realize a higher output of a light emitting element, a larger-sized element is required and a resistance to a larger power is required. As an effective structure for such higher output and higher efficiency of LED, a flip chip structure using bumps is known (for example, see patent documents 1 and 2). In the flip chip structure, LED chips are used, wherein as shown in FIG. 11, a prescribed semiconductor layer 211 having a light emitting part is grown on a transparent substrate 210 by lamination, with two electrodes 212, 213 formed on the semiconductor layer 211 for current injection, and bumps 214 are formed on the electrodes 212 and 213 respectively. The LED chips with such a flip chip structure are mounted on a metal wiring 215 on the substrate 216 via the bumps 214. In the LED with the flip chip structure, the transparent substrate 210 side is used as a light extraction surface, and a light from the light emitting part is not shielded by electrodes. Therefore, high light extraction efficiency can be realized.

[Patent Document 1]
Japanese Patent Laid Open Publication No. 2008-78225
[Patent Document 2]
Japanese Patent Laid Open Publication No. 2009-59883

However, for example, in such a flip chip mounting using the bumps as disclosed in patent documents 1 and 2, a plurality of bumps need to be formed for mounting one LED, and a control of the amount and height of the bumps, a positioning work and a bonding work for mounting LED on the bumps are not easy, thus involving a problem that bonding failure easily occurs and productivity and a yield rate are hardly improved.

BRIEF SUMMARY OF THE INVENTION

Therefore, it is desired to provide a light emitting diode with excellent heat radiation property and light emission property, and capable of realizing high productivity and yield rate.

According to a first aspect of the present invention, there is provided a light emitting diode, comprising:

a wiring layer; and
a semiconductor light emitting element provided on the wiring layer,
the semiconductor light emitting element further comprising:
a semiconductor light emitting layer including a first semiconductor layer, an active layer, and a second semiconductor layer in an order from the wiring layer side;
a transparent conductive layer provided on the wiring layer side of the semiconductor light emitting layer;
a metal reflection layer provided on the wiring layer side of the transparent conductive layer;
a transparent insulating film provided on the wiring layer side of the metal reflection layer so as to cover the metal reflection layer; and
a first electrode part and a second electrode part provided on the wiring layer side of the transparent insulating film with an isolating region interposed between them, so as to be electrically connected to the wiring layer,
wherein the first electrode part is electrically connected to the first semiconductor layer by the transparent conductive layer and a first contact part provided to pass through the transparent insulating film, and the second electrode part is electrically connected to the second semiconductor layer by a second contact part which is provided to pass through the transparent insulating film, and is provided to pass through the transparent conductive layer, the first semiconductor layer, and the active layer, while being insulated therefrom.

DETAILED DESCRIPTION OF THE INVENTION

A light emitting diode according to an embodiment of the present invention will be described by using the drawings.
(First Embodiment)

Figure 1:
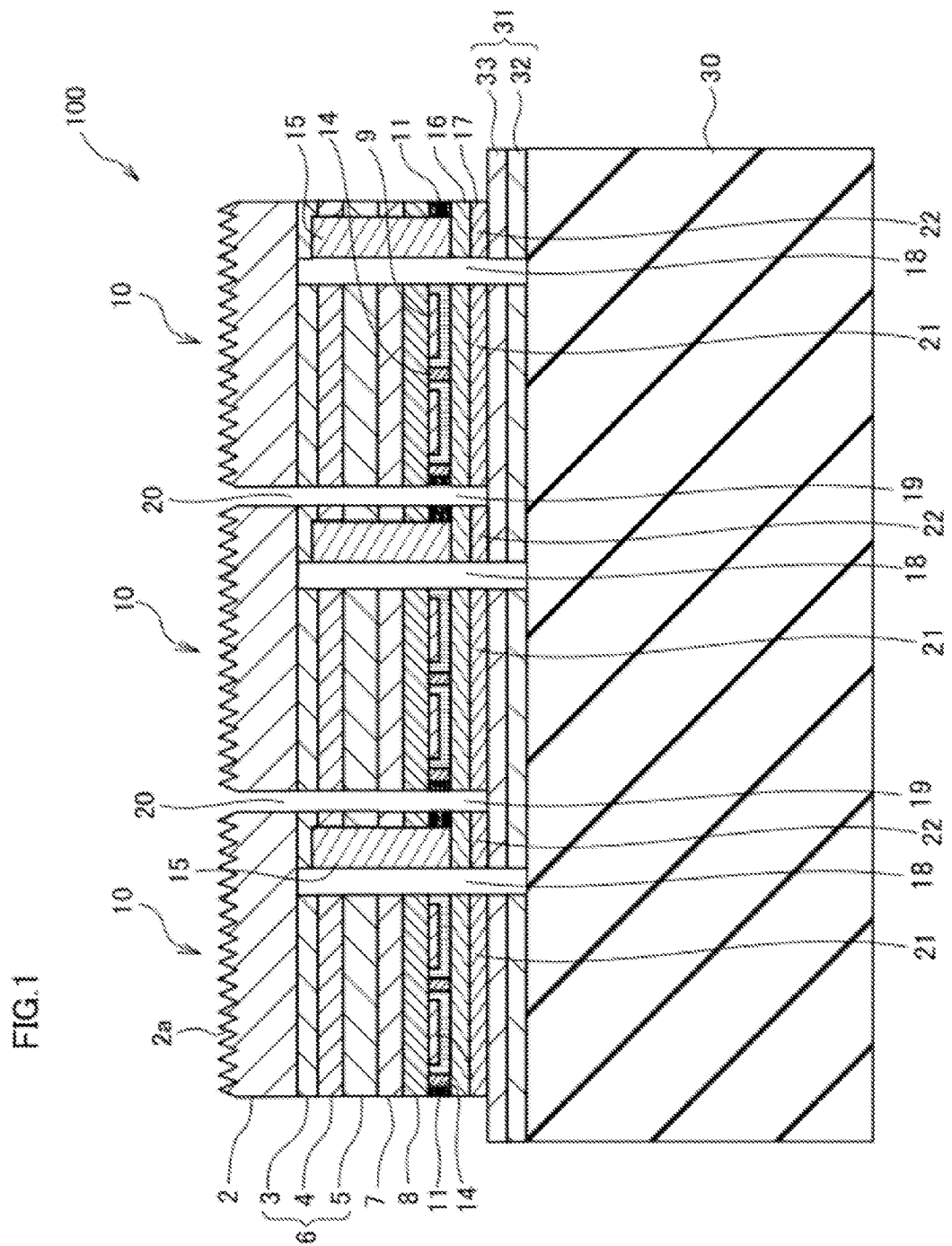
FIG. 1 is a sectional view showing a light emitting diode according to an embodiment of the present invention.

FIG. 1 shows the light emitting diode according to a first embodiment of the present invention.

A light emitting diode 100 of this embodiment has a substrate 30; a wiring layer 31 arranged on the substrate 30; and a plurality of semiconductor light emitting elements 10 provided on the wiring layer 31.

The semiconductor light emitting element 10 includes a semiconductor light emitting layer 6 having a first semiconductor layer 5, an active layer 4, and a second semiconductor layer 3, in an order from the wiring layer 31 side; a transparent conductive layer 8 provided on the wiring layer 31 side of the semiconductor light emitting layer 6; a metal reflection layer 9 provided on the wiring layer 31 side of the transparent conductive layer 8; a transparent insulating film 11 provided on the wiring layer 31 side of the metal reflection layer 9 so as to cover the metal reflection layer 9; and a first electrode part 21 and a second electrode part 22 provided on the wiring layer 31 side of the transparent insulating film 11 with an isolating regions 18 and 19 interposed between them, and electrically connected to the wiring layer 31.

The first electrode part 21 and the second electrode part 22 have a bonding layer 17 on the substrate 30 side, so that the first electrode part 21 and the second electrode part 22 are bonded to the wiring layer 31 by the bonding layer 17. The first electrode part 21 is electrically connected to the first semiconductor layer 5 by the transparent conductive layer 8, and a first contact part 14 provided to pass through the transparent insulating film 11. The second electrode part 22 is electrically connected to the second semiconductor layer 3 by a second contact part 15 which is provided so as to pass through the transparent insulating film 11 and is provided so as to pass through the transparent conductive layer 8, the first semiconductor layer 5, and the active layer 4 while being insulated therefrom.

According to this embodiment, the first electrode part 21 and the second electrode part 22 are formed so that an adhesive layer 16 and the bonding layer 17 are bonded from the transparent insulating film 11 side, and the wiring layer 31 is formed so that an adhesive layer 32 and a bonding layer 33 are laminated from the substrate 30 side. An Au-based material such as Au and Au eutectic alloy is used, for example, for a material of the bonding layer (bonding metal layer) 17 on the light emitting element side, and the bonding layer (bonding metal layer) 33 on the substrate 30 side.

Figure 11:
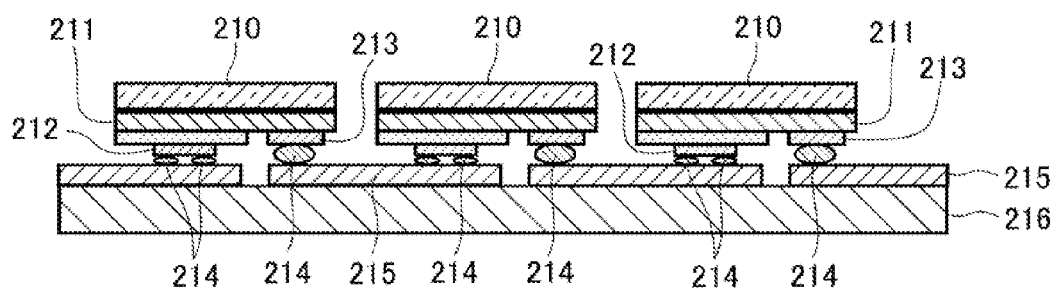
FIG. 11 is a sectional view showing a conventional light emitting diode.

The bonding layer 17 of the first electrode part 21 and the second electrode part 22, and the bonding layer 33 of the wiring layer 31 are, for example, bonded to each other by thermal compression bonding or eutectic bonding. Surfaces of the bonding layer 17 of the first electrode part 21 and the second electrode part 22 (laminating surface, bonding surface) are approximately a coplanar state, and similarly surfaces of the bonding layer 33 of the wiring layer 31 (laminating surface, bonding surface) are in a coplanar state. Therefore, the bonding layer 17 and the bonding layer 33 are set in a planar bonding state (plane bonding state) by thermal compression, etc. Therefore, bonding is ensured and facilitated, and a bonding failure can be prevented from occurring, compared with flip chip mounting using bumps (see FIG. 11).

The metal reflection layer 9 is a layer for reflecting a light emitted from the active layer 4 and reaching the transparent insulating film 11 side, toward the semiconductor light emitting layer 6, and improving light extraction efficiency. As a material of the metal reflection layer 9, a metal such as Ag, Au, Cu, Al, or an alloy containing at least one of these metals, is used. The metal reflection layer 9 is preferably made of Ag. In this embodiment, the metal reflection layer 9 is provided so as to be covered with the transparent insulating film 11 and the transparent conductive layer 8. The metal reflection layer 9 is covered with the transparent insulating film 11, for the purpose of suppressing electromigration of the material (such as Ag) that constitutes the metal reflection layer 9. When a bonding layer such as Au is provided on the transparent insulating film 11, the adhesive layer 16 is provided for the purpose of increasing adhesive property between the transparent insulating film 11 and the bonding layer. For example, the adhesive layer 16 is provided in a thickness of about 10 nm to 50 nm, by using Ti (titanium), Ni (nickel), and Al (aluminum), etc.

The semiconductor layer including the semiconductor light emitting layer 6 of this embodiment has a contact layer 7 provided on the transparent conductive layer 8 side of the first semiconductor layer 5 of the semiconductor light emitting layer 6; and a buffer layer 2 provided on the opposite side of the active layer 4 of the second semiconductor layer 3, other than the semiconductor light emitting layer 6. A main surface on the opposite side of the second semiconductor layer 3 of the buffer layer 2 is a light extraction surface 2a which is subjected to surface roughening. The light extraction surface 2a of the semiconductor light emitting element 10 is roughened, and light extraction efficiency thereof is high, because no electrode is formed thereon.

Figure 2:
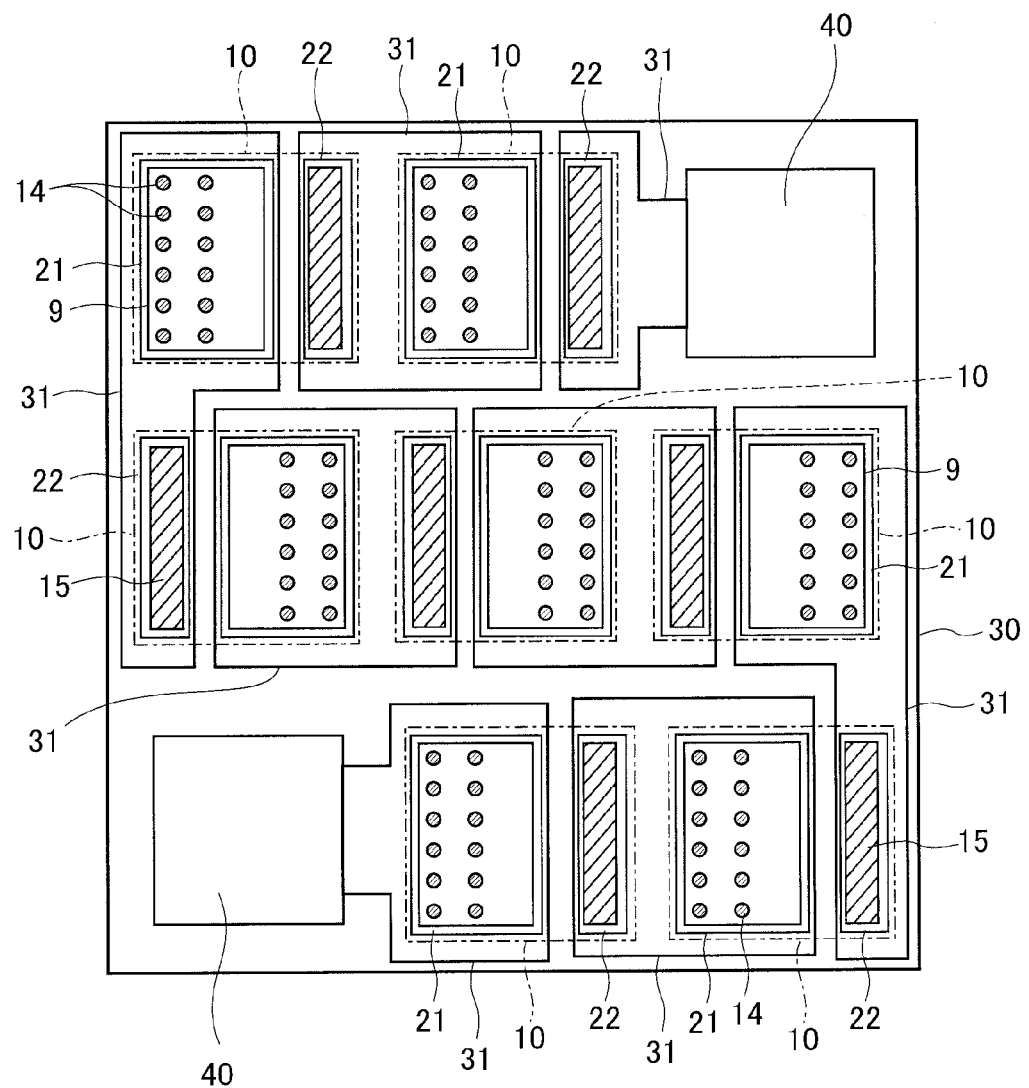
FIG. 2 is a view showing a connecting relation of a plurality of semiconductor light emitting elements in the light emitting diode of an embodiment of the present invention.

According to this embodiment, as shown in FIG. 2, the wiring layer 31 arranged on the substrate 30 is formed in a pattern in which a plurality of semiconductor light emitting elements 10 are connected in series. Namely, as shown in FIG. 2, pad electrodes 40 are formed on two wiring layers 31 which are arranged diagonally on a rectangular support substrate 30, and voltage is added between two pad electrodes 40 and 40, to thereby allow current to flow to seven semiconductor light emitting elements 10 which are connected in series in S-shape, via the wiring layer 31. Specifically, the current supplied from the wiring layer 31 which is connected to the first electrode part 21 of each semiconductor light emitting element 10, flows to the transparent conductive layer 8 through the first electrode part 21 and the first contact part 14, which is then diffused on the transparent conductive layer 8 and is supplied to the contact layer 7, and further flows through the first semiconductor layer 5, the active layer 4, the second semiconductor layer 3, and the buffer layer 2, and flows to the second electrode part 22 through the second contact part 15, and flows to the first electrode part 21 of semiconductor light emitting element 10 which is adjacent to the semiconductor light emitting element 10 and which is connected in series by the wiring layer 31 from the second electrode part 22 through the wiring layer 31.

Note that as shown in FIG. 2, first contact parts 14 are formed into dot shapes and second contact parts 15 are formed into rectangular shapes. However, they may be formed into ring shapes or branch shapes continuously. Further, by suitably changing the pattern of the wiring layer 31 on the substrate 30 and an electrode part structure of the semiconductor light emitting element 10, a plurality of semiconductor light emitting elements 10 may be formed not only in a serial connection but also in a parallel connection or in a connection of a combination of the serial connection and the parallel connection.

According to the light emitting diode 100 of this embodiment, the first electrode part 21 and the second electrode part 22 of the semiconductor light emitting element 10 are bonded to the wiring layer 31 on the substrate 30, by a planar bonding system (laminating system). Therefore, there is no electrode, being a shielding object on the light extraction surface 2a side, and the light to the substrate 30 side is reflected toward the light extraction surface 2a by the metal reflection layer 9, and therefore high light extraction efficiency can be obtained. Further, with a structure of a planar bonding between the first electrode part 21, the second electrode part 22, and the wiring layer 31, a bonding failure can be prevented from occurring even in a case of the light emitting diode 100 having a plurality of semiconductor light emitting elements 10, and emission variability of the light emitting diodes can be suppressed, and not only suppression of the bonding failure but also facilitation of the bonding can be achieved, thus making it possible to realize improvement of productivity and yield rate of the light emitting diode. Further, a heat radiation area can be taken large owing to the planar bonding, and a heat generated in the semiconductor light emitting element 10 can be efficiently escaped to the substrate 30 side from the first electrode part 21 and the second electrode part 22 via the wiring layer 31, thus improving reliability of the light emitting diode. Further, by providing a plurality of semiconductor light emitting elements 10 in series, a current value and luminance can be easily adjusted.

The light emitting diode of this embodiment will be further described in detail hereafter, together with a manufacturing step of the light emitting diode according to this embodiment. FIG. 3A to FIG. 5B respectively shows an example of the manufacturing step of manufacturing the light emitting diode 100 according to this embodiment.
(The Step of Forming the Wiring Layer on the Substrate)

Regarding the substrate (support substrate) 30, transparency to light is not required. For example, a single crystal substrate made of sapphire, Si, GaN, AlN, ZnO, SiC, BN, ZnS, and ceramics made of $Al_2O_3$, AlN, BN, MgO, ZnO, SiC, and C, etc., and a substrate made of a mixture of them, can be used. Particularly, among such materials, the substrate 30 is preferably made of a material with high resistance and high heat conductivity.

Figure 3A:
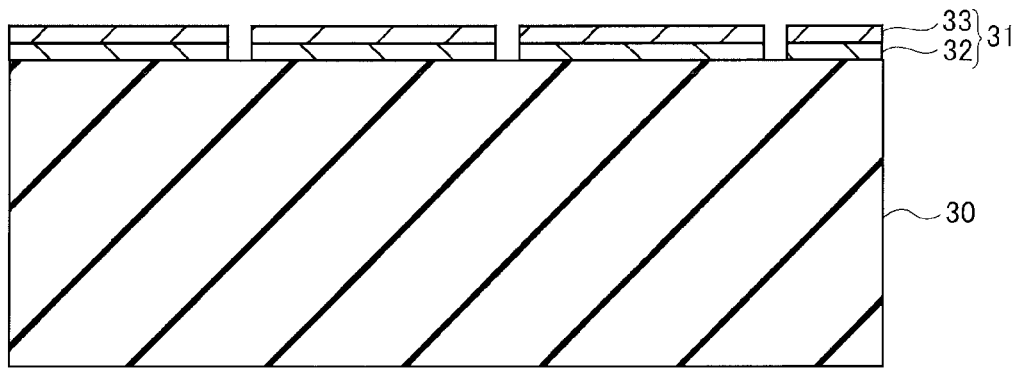
FIG. 3A is a sectional view showing a manufacturing step of manufacturing the light emitting diode according to an embodiment of the present invention.

As shown in FIG. 3A, it is desired to form the wiring layer 31, so that an adhesive layer 32 and a bonding layer 33 are sequentially formed on the substrate 30, and a wiring pattern is formed by photolithography and etching. The adhesive layer 32 is preferably made of Ti and Pt in a thickness of 1 nm or more and 50 nm or less. The bonding layer 33 is preferably made of Au and Au eutectic alloy in a thickness of 0.5 μm to 2.0 μm.
(The Step of Forming an Epitaxial Layer on the Substrate for Growth)

Figure 3B:
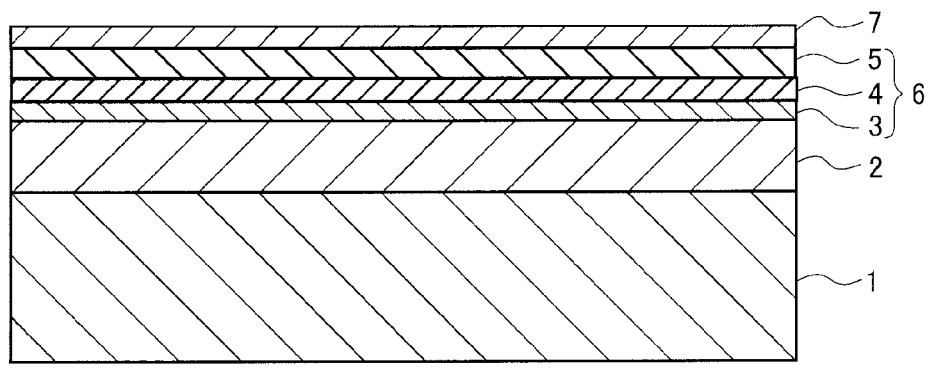
FIG. 3B is a sectional view showing a manufacturing step of manufacturing the light emitting diode according to an embodiment of the present invention.

In the production of the semiconductor light emitting element 10, first, a group III-V compound semiconductor layers are formed by lamination on the substrate for growth, as a light emitting epitaxial layer (FIG. 3B). When nitride semiconductor epitaxial layers are formed, for example, a sapphire substrate 1 is prepared as the substrate for growth, and GaN buffer layer (thickness: 4 μm) 2, n-type GaN clad layer (thickness: 3 μm) 3, being a second semiconductor layer, undoped InGaN active layer (5 to 6 pairs of well layer and barrier layer) 4, being an active layer formed in a quantum well structure, p-type AlGaN clad layer (thickness: 40 nm) 5, being a first semiconductor layer, and p-type GaN layer (thickness: 300 nm) 7 are sequentially grown on the sapphire substrate 1 by HVPE (Hydride Vapor Phase Epitaxy) method, or MOVPE (Metal-Organic Vapor Phase Epitaxy) method, to thereby form an epitaxial wafer.

InGaN active layer 4 of this embodiment is formed so that In composition ratio of the well layer is 0.15, and In composition ratio of the barrier layer is 0 to 0.05. Further, GaN buffer layer 2 is formed by n-type GaN layer, and for example, is formed with a carrier concentration of $5\times10^{17}$ to $1\times10^{18}$ $cm^{-3}$.
(The Step of Forming the Transparent Conductive Layer and the Metal Reflection Layer)

Figure 3C:
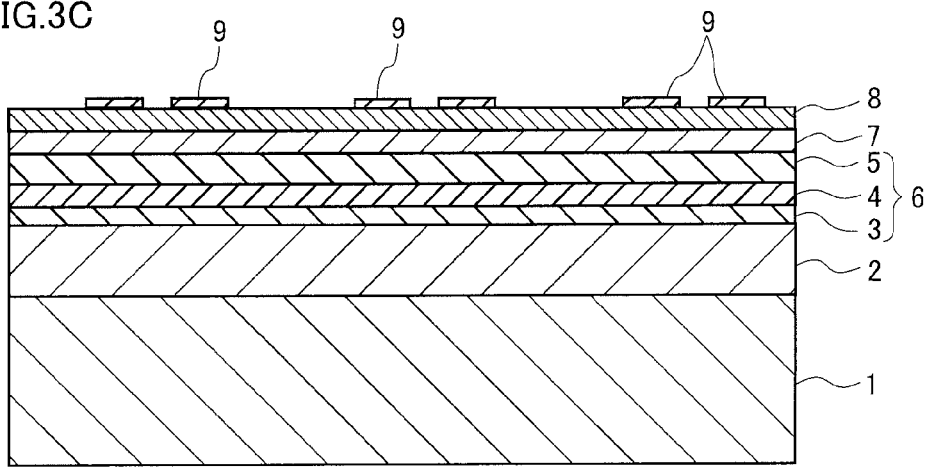
FIG. 3C is a sectional view showing a manufacturing step of manufacturing the light emitting diode according to an embodiment of the present invention.

Next, as shown in FIG. 3C, the transparent conductive layer 8 that functions as a current dispersion layer, is formed on the p-type GaN layer 7. ITO (indium tin oxide), etc., is used for the transparent conductive layer 8. Further, the metal reflection layer 9 is formed at a prescribed part of the transparent conductive layer 8. The metal reflection layer 9 is formed, for example, by forming Ag layer on an entire surface of the transparent conductive layer 8 by vapor deposition, and removing the Ag layer by etching at a part where the first contact part 14 and the second contact part 15 are formed.
(The Step of Forming the Transparent Insulating Film, the First Contact Part, and the Second Contact Part)

Figure 4A:
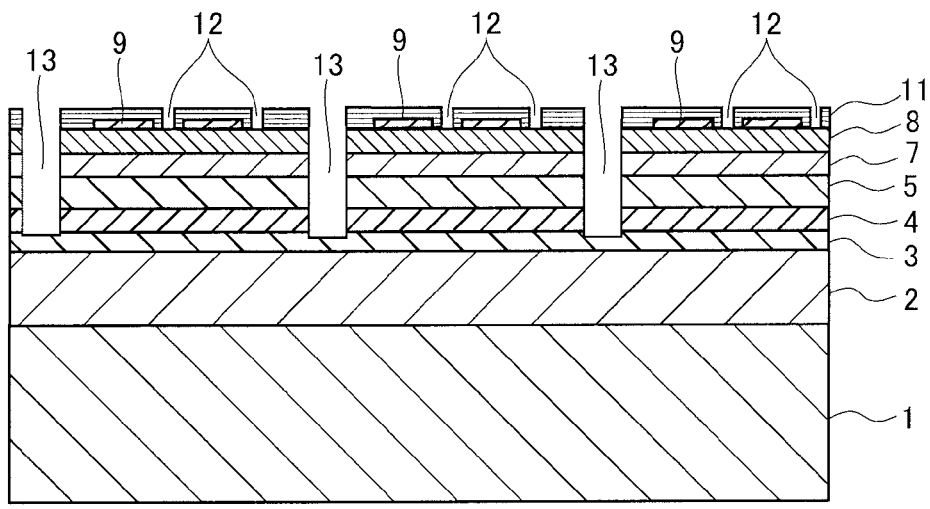
FIG. 4A is a sectional view showing a manufacturing step of manufacturing the light emitting diode according to an embodiment of the present invention.

Next, as shown in FIG. 4A, the transparent insulating film 11 is formed so as to cover the metal reflection layer 9 on the transparent conductive layer 8. For example, $SiO_2$ or SiN, etc., is used for the transparent insulating film 11. The metal reflection layer 9 is set in a state of being covered and enclosed by the transparent conductive layer 8 and the transparent insulating film 11. Subsequently, holes 12 are formed for forming p-type contact parts 14, being the first contact parts so as to pass through the transparent insulating film 11, by using photolithography and etching. Further, holes 13 are formed for forming n-type contact parts 15, being the second contact parts, so as to pass through the transparent insulating film 11, the transparent conductive layer 8, the p-type GaN layer 7, p-type AlGaN clad layer 5, and the InGaN active layer 4, to the n-type GaN clad layer 3.

At this time, an insulating film (such as $SiO_2$) not shown may be provided on a side face of each hole 13 for the n-type contact part 15, for insulating from the transparent conductive layer 8, the p-type GaN layer 7, the p-type AlGaN clad layer 5, and the InGaN active layer 4. However, the hole 13 has a shallow (thin) depth (thickness of the epitaxial layer) of about 1 μm, while having a diameter of about 5 to 10 μm. Therefore, even if the insulating film is not formed, insulating property between the n-type contact part 15 and the transparent conductive layer 8, and the p-type GaN layer 7, etc., can be ensured by a gap not shown, by accurately forming the hole 13 and the n-type contact part 15.

Figure 4B:
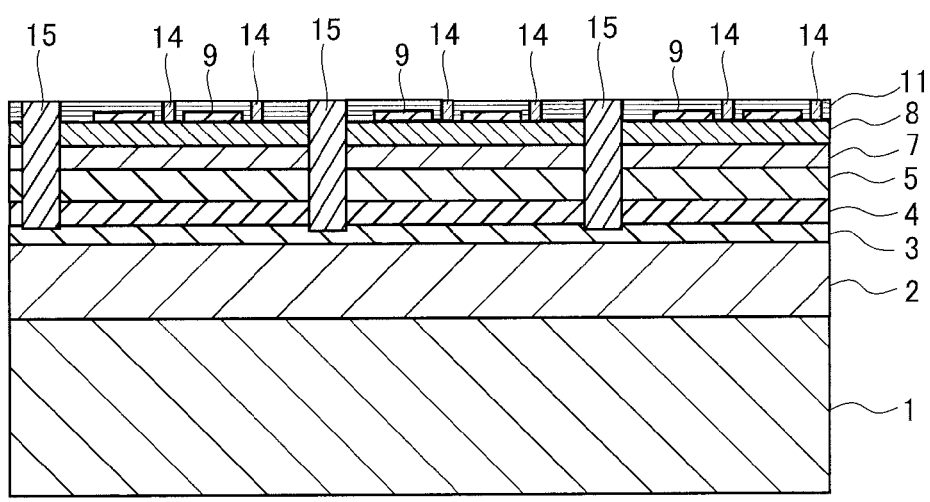
FIG. 4B is a sectional view showing a manufacturing step of manufacturing the light emitting diode according to an embodiment of the present invention.

Next, as shown in FIG. 4B, the p-type contact part 14 and the n-type contact part 15 are formed by providing Au-based metal to holes 12 and 13. For example, NiAu is used for the material of the p-type contact part 14 and the n-type contact part 15.
(The Step of Forming the First Electrode Part and the Second Electrode Part)

Figure 4C:
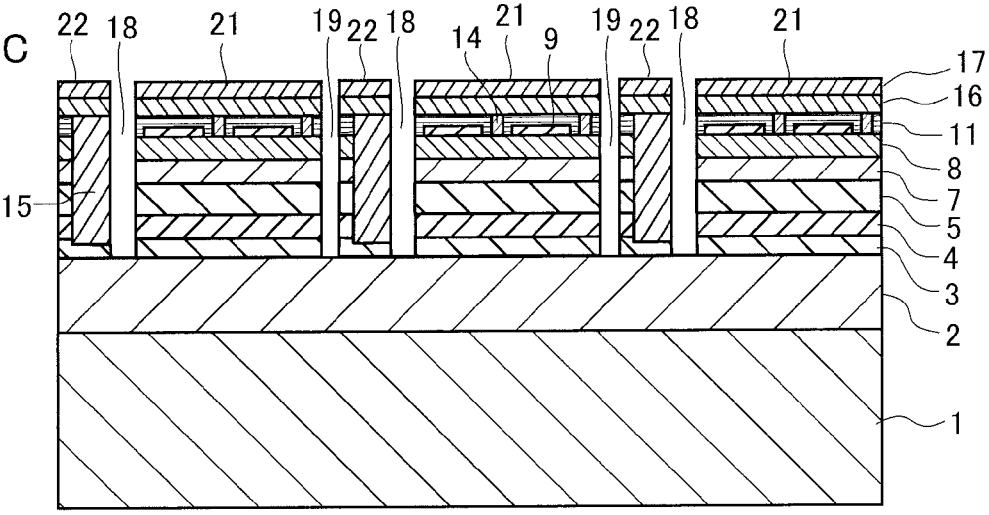
FIG. 4C is a sectional view showing a manufacturing step of manufacturing the light emitting diode according to an embodiment of the present invention.

Next, as shown in FIG. 4C, for example, the adhesive layer 16 made of Ti and the bonding metal layer 17 made of Au are formed by lamination on the transparent insulating film 11, the p-type contact part 14, and the n-type contact part 15 by vacuum deposition, as an electrode layer for constituting the p-side electrode part 21, being the first electrode part, and the n-side electrode part 22, being the second electrode part.

Further, electrode separating grooves (isolation grooves) 18 and element separating grooves (isolation grooves) 19, being isolating regions, are formed over the adhesive layer 16, the bonding metal layer 17, the transparent insulating film 11, the transparent conductive layer 8, the p-type GaN layer 7, the p-type AlGaN clad layer 5, the InGaN active layer 4, and the n-type GaN clad layer 3, by using a photolithography method and an etching method, so that the p-side electrode part 21, the transparent conductive layer 8, etc., connected to the p-side electrode part 21, and the n-side electrode part 22, the transparent conductive layer 8, etc., connected to the n-side electrode part 22 are not communicated with each other. Thus, the p-side electrode part 21 and the n-side electrode part 22 are formed in such a manner as being separated from each other. The surface of the bonding metal layer 17 of the p-side electrode part 21 and the surface of the bonding metal layer 17 of the n-side electrode part 22 are the same heights.

Note that an insulating matter such as $SiO_2$ may be provided to each electrode separating groove 18. When the insulating matter is provided inside the electrode separating groove 18, electric insulating property between the p-side electrode part 21 and the n-side electrode part 22 is further ensured.

(Bonding Step)

Figure 5A:
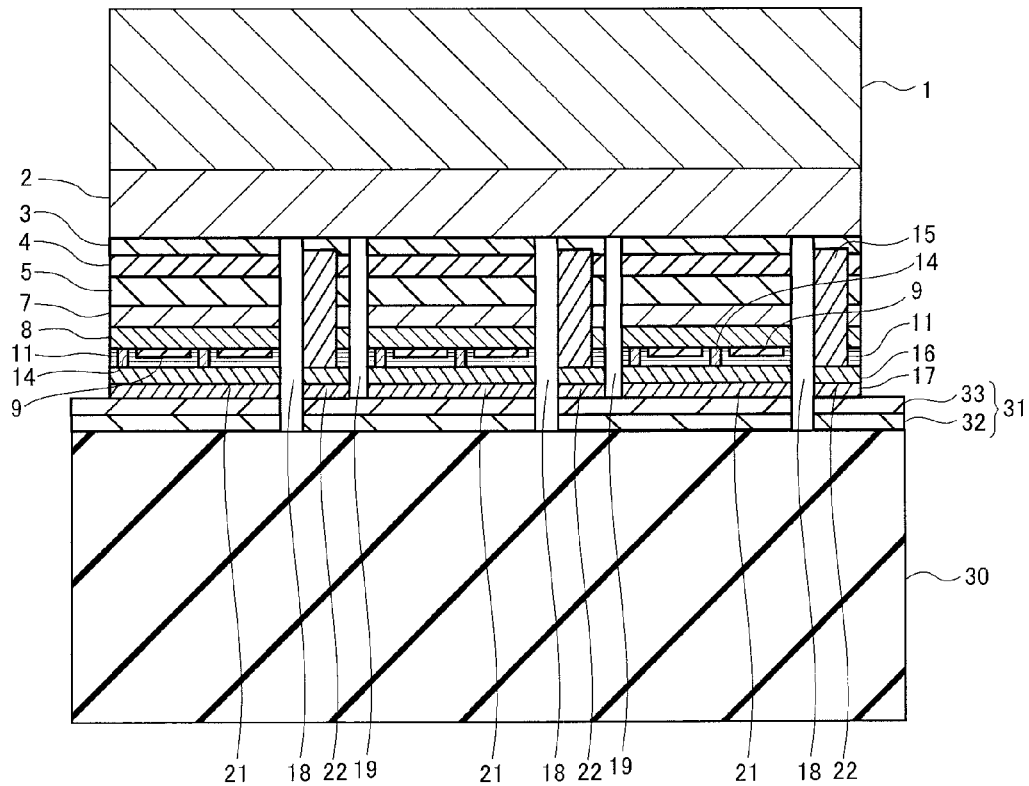
FIG. 5A is a sectional view showing a manufacturing step of manufacturing the light emitting diode according to an embodiment of the present invention.

The substrate (support substrate) 30 with the wiring layer 31 shown in FIG. 3A formed thereon, and the epitaxial wafer with the semiconductor light emitting element 10 having the p-side electrode part 21 and the n-side electrode part 22 shown in FIG. 4C formed thereon, are bonded to each other as shown in FIG. 5A, to thereby manufacture a bonded wafer.

Specifically, positioning of the wiring layer 31, the p-side electrode part 21 and the n-side electrode part 22 is performed by using a bonding apparatus having a positioning function for a micro machine, and the bonding layer 33 of the wiring layer 31 and the bonding metal layer 17 of the p-side electrode part 21 and the n-side electrode part 22 are brought into tight contact with each other, so as to be bonded to each other by thermal compression. Specifically, the support substrate 30 and the epitaxial wafer are respectively set in the bonding apparatus, in a tight adhesion state by giving pressure thereto and by raising a temperature to 350° C., in a high vacuum state. Such a state is maintained for 1 hour, and thereafter the temperature is decreased to a room temperature and pressurization is canceled, to thereby obtain a bonded wafer. Note that bonding between the substrate 30 and the epitaxial wafer may also be performed by eutectic bonding, other than bonding by thermal compression.

(The Step of Removing the Substrate for Growth and Roughening the Light Extraction Surface)

Figure 5B:
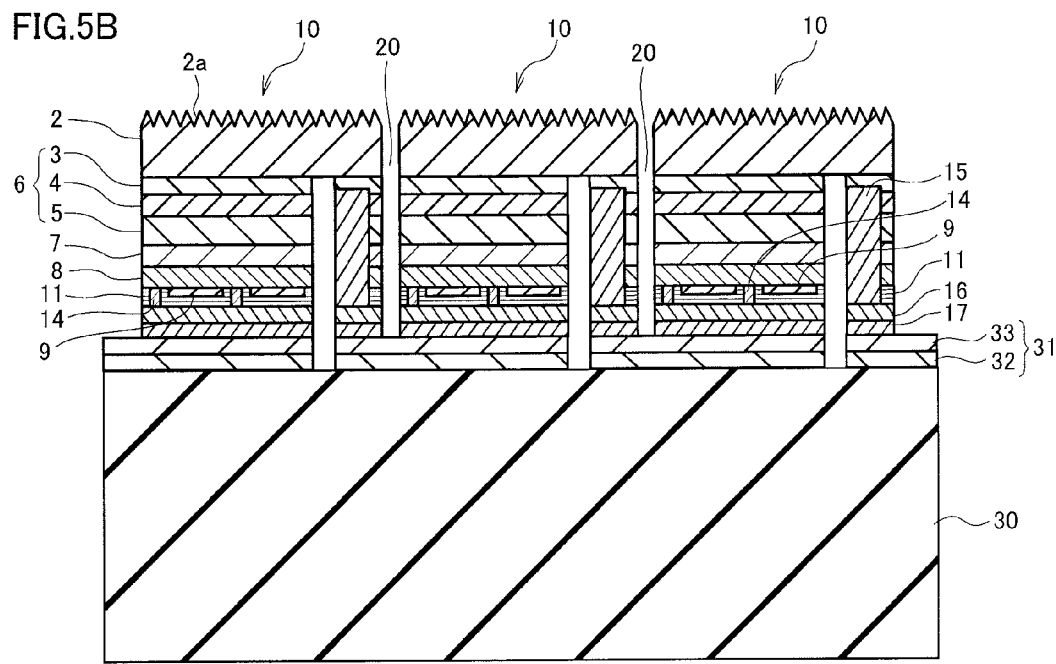
FIG. 5B is a sectional view showing a manufacturing step of manufacturing the light emitting diode according to an embodiment of the present invention.

After bonding, the substrate 1 for growth, being the sapphire substrate of the bonded wafer, is removed by laser processing (FIG. 5B). Note that the substrate for growth may also be removed not only by the laser processing but also by lapping or etching.

Note that in a case of a transparent substrate like the sapphire substrate, the substrate for growth may not be necessarily removed. In this case, by forming an uneven part on the side where the buffer layer of the sapphire substrate is provided, a light extraction amount toward the sapphire substrate from the semiconductor layer side can be improved. When the buffer layer is formed, a growth condition is suitably adjusted so as not to generate the gap between the sapphire substrate and the buffer layer. Further, the thickness of the sapphire substrate 1 is, for example, about 400 μm, when the sapphire substrate has a diameter of 2 inches. When the sapphire substrate is remained without being removed, the sapphire substrate is preferably made thin by a backlap process, after the step of forming the epitaxial layer in which the semiconductor layer is grown on the sapphire substrate, or after the bonding step. This is because time is required for making a thick sapphire substrate into chips by cutting it by a dicer because the sapphire substrate is hard, and therefore for example, the sapphire substrate having a thickness of about 400 μm is made thin to about 80 μm. Further, a groove is formed on the thinned sapphire substrate surface by a laser scriber, and thereafter the bonded wafer with the sapphire substrate is separated into each chip by breaking.

Figure 6:
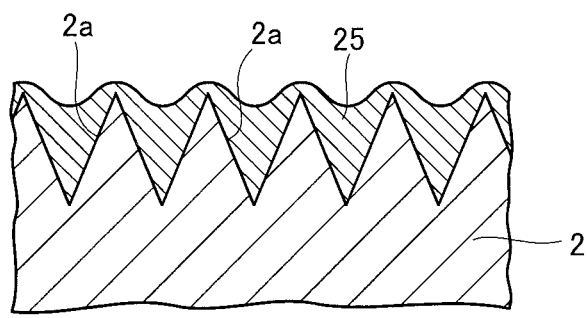
FIG. 6 is a sectional view showing an example of a light extraction surface in the light emitting diode according to an embodiment of the present invention.

After the substrate 1 for growth is removed, roughening process is performed to the surface of the GaN buffer layer 2, being the light extraction surface 2a. In the roughening process, for example, as shown in FIG. 5B, a prescribed uneven shape is formed on the light extraction surface 2a, by using photolithography and dry etching. Thus, the improvement of the light extraction efficiency to outside the semiconductor light emitting element 10 can be achieved. Further, as shown in FIG. 6, a conductive film 25 having transmissive property such as an ITO film or a metal thin film may be formed on the roughened surface 2a of the n-type GaN buffer layer 2. By providing the conductive film 25 having transmissive property, current dispersion performance can be improved, emission irregularity can be suppressed, and high output can be achieved. Further, the roughened surface 2a is protected and an uppermost surface of the light extraction surface becomes a smooth wave-shaped curved surface. Therefore, the improvement of the light extraction efficiency owing to lens effect can also be expected.

(Element Separation (Isolation) and Dicing Step)

Next, as shown in FIG. 5B, the GaN buffer layer 2 located in an upper part of the element separating groove 19 and formed between the first electrode part 16 and the second electrode part 17 is removed by dry etching and the element separating groove 20 is formed, so that the element is separated into a plurality of semiconductor light emitting elements 10 having prescribed sizes. Further, when a pad electrode is formed on the wiring layer 31, the wiring layer 31 is exposed by etching the semiconductor light emitting layer 6, etc., in a region where the pad electrode is formed.

After separation into a plurality of semiconductor light emitting elements 10, a groove for cutting (singulation grooves not shown) is formed by etching on the semiconductor light emitting layer 6, etc., so as to have a prescribed shape, and the substrate 30, etc., is cut by a dicing blade at a position of the singulation groove, so as to be singulated into a prescribed sized light emitting diode. At this time, a width of the pelletizing groove having a sufficient margin (for example, 50 μm) is set, with respect to a width of the dicing blade (for example, 30 μm).

Note that by forming the transparent insulating film with low refractive index on the side face of the semiconductor light emitting element 10, the side face of the semiconductor light emitting element 10 is protected, and the improvement of the light extraction efficiency may be achieved. For example, $SiO_2$ or SiN, etc., is used for the transparent insulating film.

(Other Embodiment)

Figure 7A:
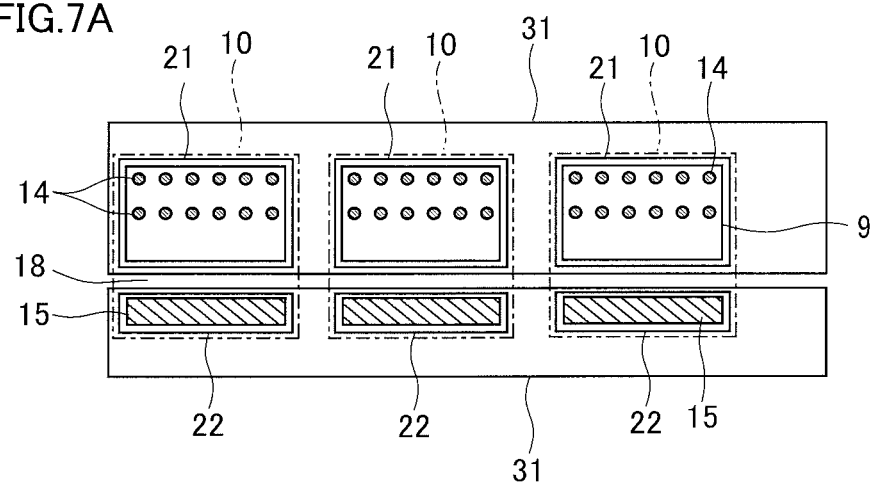
FIG. 7A is a view showing a connecting relation of a plurality of semiconductor light emitting elements in the light emitting diode according to other embodiment of the present invention.
Figure 7B:
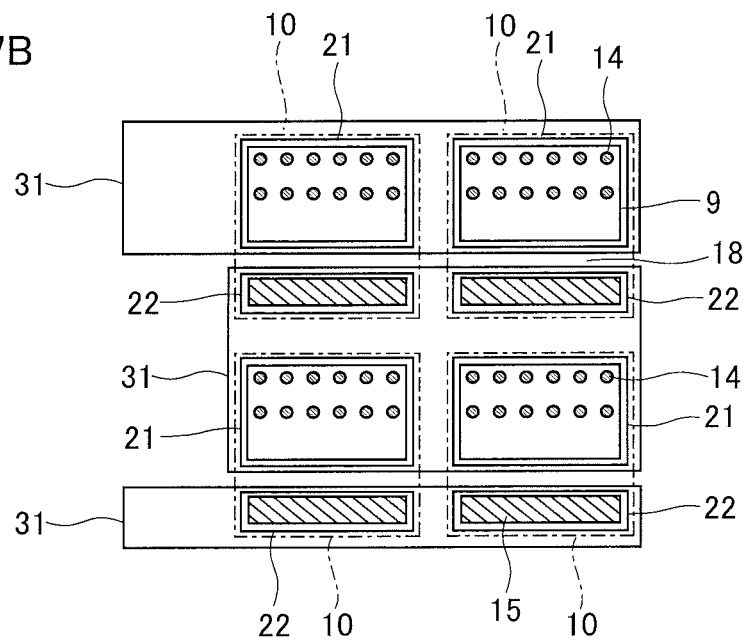
FIG. 7B is a view showing a connecting relation of a plurality of semiconductor light emitting elements in the light emitting diode according to other embodiment of the present invention.

According to the first embodiment, the light emitting diode 100 with a plurality of semiconductor light emitting elements 10 connected in series, has been described. However, the plurality of semiconductor light emitting elements 10 may be connected in parallel, or may be connected in combination of a serial connection and a parallel connection. FIG. 7A shows an example of an electrode part and a wiring layer structure, with three semiconductor light emitting elements 10 connected in parallel. Further, FIG. 7B shows an example of an electrode part and a wiring layer structure, with two semiconductor light emitting elements 10 at the right side connected in series, and two semiconductor light emitting elements at the left side connected in parallel.

Figure 8:
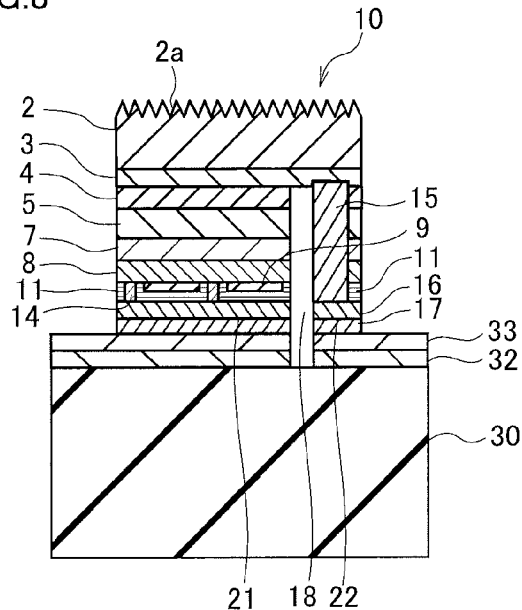
FIG. 8 is a sectional view showing the light emitting diode according other embodiment of the present invention.

In this embodiment, the light emitting diode with a plurality of semiconductor light emitting elements 10 connected in series and in parallel has been described. However, as shown in FIG. 8, of course the light emitting diode of the present invention may be one element type light emitting diode with one semiconductor light emitting element 10 formed on the substrate 30. Note that in the light emitting diode shown in FIG. 8, undoped GaN layer is used for the GaN buffer layer 2. By forming the buffer layer 2 using the undoped layer, the semiconductor light emitting layer 6 with suppressed dislocation (defect) can be formed. With employment of the undoped GaN buffer layer, the electrode separating groove 18 is formed so that the second semiconductor layer 3 (n-type clad layer 3) is remained. A current path in this embodiment is formed, so that a current injected from the first electrode part 21 flows to the transparent conductive layer 8 through the first contact part 14, diffused by the transparent conductive layer 8 and the contact layer 7, and further supplied to the first semiconductor layer 5 and the active layer 4, then flows to the second semiconductor layer 3, and flows to the second electrode part 22 through the second contact part 7.

Further, when the undoped GaN buffer layer 2 is used, n-type GaN current dispersion layer, being a current dispersion layer, may be provided between the GaN buffer layer 2 and the second semiconductor layer 3. For example, the n-type GaN current dispersion layer may be formed with carrier concentration of $1 \times 10^{18}$ cm$^{-3}$, and thickness of 3.0 to 5.0 µm.

Figure 9:
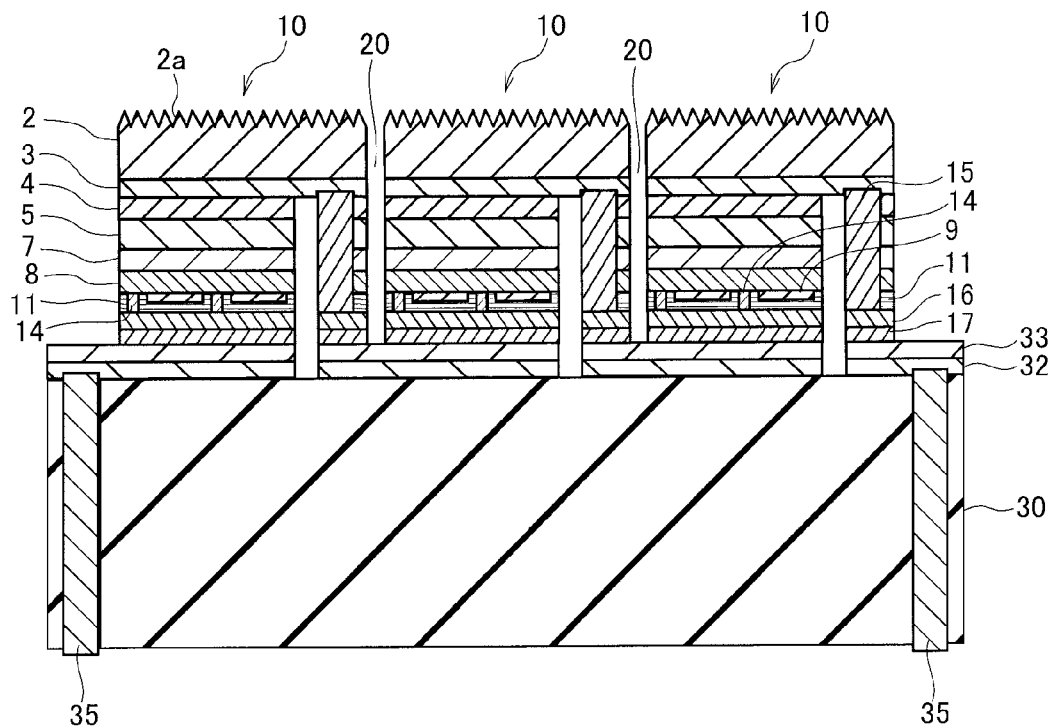
FIG. 9 is a sectional view showing the light emitting diode according to other embodiment of the present invention.

Further, as shown in FIG. 9, a substrate contact part 35 electrically connected to the wiring layer 31 may be formed by forming the through hole on the substrate 30 and filling it with a metal material of the through hole. A pair or more of substrate contact parts 35 are provided to one light emitting diode. The substrate contact parts 35 are connected to wiring (not shown), etc., on a rear side of the substrate 30, to thereby supply the current to the light emitting diode through the substrate contact parts 35. By using the substrate contact parts 35, there is no need for providing a region of the pad electrode on the wiring layer 31, and this contributes to miniaturization of the light emitting diode. Further, in a structure of having the substrate contact parts 35, wire bonding can be eliminated, and the structure and connection of the electrode part and wiring can be simplified, and a current amount can be easily increased.

Further, the light emitting diode of this embodiment is formed so that a gallium nitride semiconductor light emitting element is formed on the substrate. However, for example, red to green semiconductor light emitting elements may be formed, by using GaAs for the substrate for growth, and using AlGaInP-based material and AlGaAs-based material for the semiconductor light emitting layer. Further, in this embodiment, a conductive type of n-type and p-type of the semiconductor light emitting layer 6, etc., may be inverted.

Further, in this embodiment, DC flows to one or a plurality of semiconductor light emitting elements 10 connected in series. However, the semiconductor light emitting element 10 may be driven by using a commercial AC power. When the commercial AC power is used, there is a problem such as being hard to see, due to a blinking light of the light emitting element by flowing AC to the semiconductor light emitting element 10 as it is. In this case, for example, a frequency multiplication circuit may be provided on the substrate 30 for increasing the frequency by twice or four times, or a bridge rectifier circuit may be provided for rectifying and smoothing the AC.

Example

Next, an example of the present invention will be described.

The light emitting diode (LED) according to an example was manufactured, based on the structure of the light emitting diode according to the embodiment of the present invention.

Figure 10:
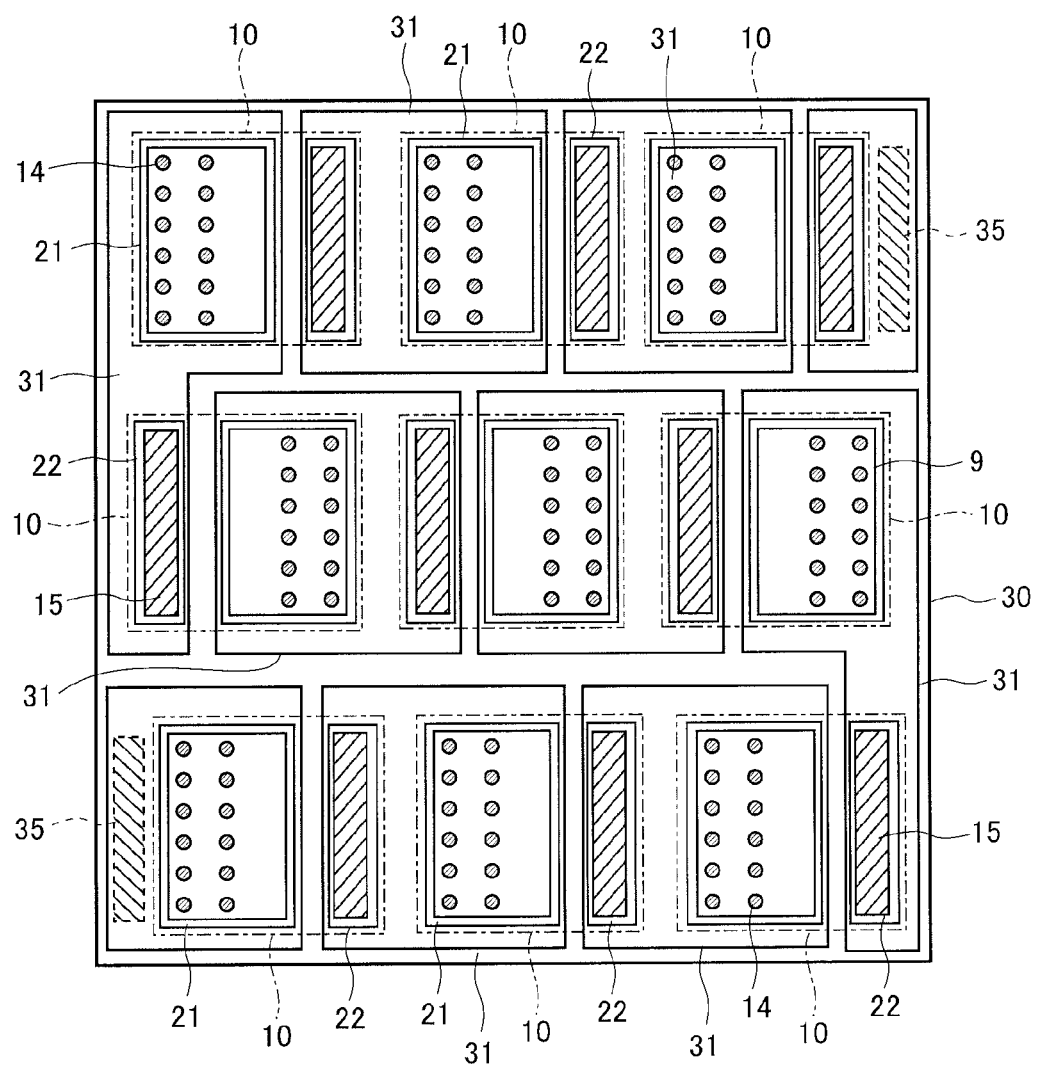
FIG. 10 is a view showing the connecting relation of a plurality of semiconductor light emitting elements in the light emitting diode of an example of the present invention.

As shown in FIG. 10, in the LED of an example, nine semiconductor light emitting elements 10 are arranged in a grid-point pattern on a rectangular substrate 30. Further, in FIG. 10, the substrate contact parts 35 are provided in the vicinity of the semiconductor light emitting elements 10 in an upper right corner and in a lower left corner on the substrate 30, and a voltage is applied between the two substrate contact parts 35 and 35, to allow the current to flow to the nine semiconductor light emitting elements 10 connected in series in S-shapes through the wiring layers 31.

The epitaxial layer including the semiconductor light emitting layer of the semiconductor light emitting element 10 was formed by a gallium nitride-based semiconductor, similarly to the aforementioned embodiment. ITO was used for the transparent conductive layer, Ag was used for the metal reflection layer, SiO$_2$ was used for the transparent insulating film, NiAu was used for the p-type contact part and the n-type contact part, and Au was used for the bonding layer and the bonding metal layer, respectively.

Further, regarding a size of each part, an element size of the semiconductor light emitting element 10 was set to 300 µm×300 µm, a sectional area of the metal reflection layer of Ag was set to 260 µm×130 µm (the metal reflection layer was formed only at the side of the p-type electrode part), 500 columnar electrodes with diameter of 5 µm were arranged in the p-type contact part (first contact part), and a sectional area of the n-type contact part (second contact part) was set to 260 µm×20 µm.

Light emission and electric property of the nitride-based LED of this example were measured. When the current: 40 mA flows, the voltage was 35.8V, which was a high value compared with a normal blue LED. This is because nine semiconductor light emitting elements 10 are connected in series. Brightness at this time was 24 lumen, with a wavelength of 460 nm, and light emission efficiency was 161 m/W, which was an extremely high value as the blue LED. The reason why such a high value was obtained in a case of the blue LED, is that the light extraction efficiency is increased by having no electrode (shielding object) on the surface (light extraction surface), similarly to the LED of a conventional flip chip structure (see FIG. 11). However, such a high light extraction efficiency could not be obtained by the LED of the conventional flip chip structure. This is because a defect is generated in the active layer, by a bump connection during flip chip mounting. In this example, the wiring layer and the p-side electrode part, the n-side electrode part are bonded by metal planar bonding, and therefore wafer bonding (lamination) can be made by adding uniform force to the active layer, thus making it possible to achieve a high internal quantum efficiency. Further, planar bonding with a wider surface is achieved by laminating, thus making it possible to achieve excellent heat radiation property and suppress rise of the temperature of the active layer by energization.

Conventionally, in order to obtain LED with high luminance, input power into the LED needs to be increased. The size of the conventional LED chip allows a current of 360 mA (40 mA×9) to flow. It is difficult to flow such a volume of current by thin wiring as mounting wiring, and thick wiring needs to be used. Further, a power transistor is required as a transistor for controlling the current, thus increasing the size of the element and accordingly incurring a high cost. Meanwhile, a transistor responding to a small current although having a high withstanding voltage suffices as the transistor used for driving the LED having the structure of this example. Therefore, mounting of nine semiconductor light emitting elements 10 can be performed easily by a single mounting, and also a circuit in a periphery of the LED can be miniaturized at a low cost. Particularly, in a switching drive, its effect can be exhibited at a maximum.

Further, current dispersion is carried out by the transparent conductive layer, and therefore the number of dot-shaped p-type contact parts can be reduced, and an arrangement position of the p-type contact parts can be formed at the end of each LED element (as an example of an arrangement relation, the p-type contact part, the metal reflection layer, and the n-type contact part are arranged in this order on a formation surface of the transparent insulating film). Thus, an area of the metal reflection layer can be taken wider, thus making it possible to achieve the improvement of the light extraction efficiency.

Note that LED with the transparent conductive layer of this example omitted was manufactured for comparison, current dispersion was not satisfactory, and emission irregularity was observed. It can be considered that the number of the p-type contact parts is increased to eliminate the emission irregularity. However, when the number of the p-type contact parts was increased, the area of the metal reflection layer became narrower and as a result, it was confirmed that the light extraction efficiency was reduced.

What is claimed is:

1. A light emitting diode, comprising:
    a wiring layer; and
    a semiconductor light emitting element provided on the wiring layer,
    the semiconductor light emitting element further comprising:
    a semiconductor light emitting layer including a first semiconductor layer, an active layer, and a second semiconductor layer in an order from the wiring layer side;
    a transparent conductive layer provided on the wiring layer side of the semiconductor light emitting layer;
    a metal reflection layer provided on the wiring layer side of the transparent conductive layer;
    a transparent insulating film provided on the wiring layer side of the metal reflection layer so as to cover the metal reflection layer; and
    a first electrode part and a second electrode part provided on the wiring layer side of the transparent insulating film with an isolating region interposed between them, so as to be electrically connected to the wiring layer,
    wherein the first electrode part is electrically connected to the first semiconductor layer by the transparent conductive layer and a first contact part provided to pass through the transparent insulating film, and the second electrode part electrically connected to the second semiconductor layer by a second contact part which is provided to pass through the transparent insulating film, and is provided to pass through the transparent conductive layer, the first semiconductor layer, and the active layer, while being insulated therefrom.

2. The light emitting diode according to claim 1, wherein the first electrode part and the second electrode part are bonded to the wiring layer by planar bonding.

3. The light, emitting diode according to claim 1, wherein the first electrode part and the second electrode part have an Au-based bonding layer, and are bonded to the Au-based wiring layer through the bonding layer.

4. The light emitting diode according to claim 1, wherein the first semiconductor layer, the active layer, and the second semiconductor layer, which form the semiconductor light emitting layer, are made of a nitride semiconductor respectively, and the metal reflection layer is made of Ag.

5. The light emitting diode according to claim 1, wherein a plurality of semiconductor light emitting elements are provided on the wiring layer.

6. The light emitting diode according to claim 1, wherein a light extraction surface subjected to a roughening process is formed at an opposite side to the wiring layer of the semiconductor light emitting layer.

7. The light emitting diode according to claim 6, wherein a transmissive conductive film is formed on the light extraction surface.

8. The light emitting diode according to claim 1, wherein the wiring layer is provided on an insulating substrate, and two or more through holes are formed on the insulating substrate, and a metal material is provided into the through holes, to thereby form substrate contact parts which are electrically connected to the wiring layer.

9. A light emitting diode, comprising:
    a wiring layer; and
    a semiconductor light emitting element provided on the wiring layer,
    the semiconductor light emitting element further comprising:
    a semiconductor light emitting layer including a first semiconductor layer, an active layer, and a second semiconductor layer in an order from the wiring layer side;
    a transparent conductive layer provided on the wiring layer side of the semiconductor light emitting layer;
    a transparent insulating film provided on the wiring layer side of the transparent conductive layer; and
    a first electrode part and a second electrode part provided on the wiring layer side of the transparent insulating film with an isolating region interposed between them, so as to be electrically connected to the wiring layer,
    wherein the first electrode part is electrically connected to the first semiconductor layer by the transparent conductive layer and a first contact part provided to pass through the transparent insulating film, and the second electrode part electrically connected to the second semiconductor layer by a second contact part which is provided to pass through the transparent insulating film, and is provided to pass through the transparent conductive layer, the first semiconductor layer, and the active layer, while being insulated therefrom.

* * * * *